(12) United States Patent  
Wayman

(10) Patent No.: US 7,457,123 B1
(45) Date of Patent: Nov. 25, 2008

(54) CHASSIS MOUNTED HEAT SINK SYSTEM

(75) Inventor: Michael J. Wayman, Waconia, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 19 days.

(21) Appl. No.: 11/747,039

(22) Filed: May 10, 2007

(51) Int. Cl.
H05K 7/20 (2006.01)

(52) U.S. Cl. .................. 361/704; 361/688; 361/707; 361/709; 361/710; 165/185

(58) Field of Classification Search .................. None
See application file for complete search history.

(56) References Cited

U.S. PATENT DOCUMENTS

| | | | |
|---|---|---|---|
| 3,997,819 A * | 12/1976 | Eggert et al. ................. | 361/704 |
| 4,656,559 A | 4/1987 | Fathi | |
| 5,089,935 A | 2/1992 | Ito | |
| 5,150,278 A | 9/1992 | Lynes et al. | |
| 5,251,099 A * | 10/1993 | Goss et al. .................. | 361/721 |
| 5,267,122 A | 11/1993 | Glover et al. | |
| 5,825,621 A * | 10/1998 | Giannatto et al. ........... | 361/701 |
| 5,842,514 A | 12/1998 | Zapach et al. | |
| 5,946,193 A * | 8/1999 | Hendrix et al. ............. | 361/704 |
| 6,104,611 A | 8/2000 | Glover et al. | |
| 6,118,662 A * | 9/2000 | Hutchison et al. ........... | 361/704 |
| 6,404,636 B1 * | 6/2002 | Staggers et al. ............. | 361/704 |
| 6,404,637 B2 * | 6/2002 | Hutchison et al. ........... | 361/704 |
| D462,675 S | 9/2002 | Kusz et al. | |
| 6,510,223 B2 | 1/2003 | Laetsch | |
| 6,535,603 B2 * | 3/2003 | Laetsch ....................... | 379/338 |
| 6,563,050 B2 | 5/2003 | Gustine et al. | |
| 6,587,339 B1 | 7/2003 | Daniels et al. | |
| 6,628,521 B2 | 9/2003 | Gustine et al. | |
| 6,781,830 B2 | 8/2004 | Barth et al. | |
| 6,862,180 B2 | 3/2005 | Sawyer et al. | |
| 6,865,085 B1 | 3/2005 | Ferris et al. | |
| 6,894,907 B2 | 5/2005 | Gustine et al. | |
| 6,897,377 B2 | 5/2005 | Gustine et al. | |
| 6,992,249 B2 | 1/2006 | Gustine et al. | |
| 7,075,789 B2 | 7/2006 | Gustine et al. | |
| 7,118,697 B2 | 10/2006 | Sawyer et al. | |
| 2005/0170681 A1 | 8/2005 | Gustine et al. | |

OTHER PUBLICATIONS

Fox et al., "Star-Structure Optical Local Networks", "British Telecommunications Technology Journal", Apr. 1989, pp. 76-88, vol. 7, No. 2, Publisher: Fulcrum.

The Berquist Company, "Ultra Conformable, Thermally, Conductive Material for Filling Air Caps", "Gap Pad VO Ultra Soft", May 7, 2007, p. 1.

The Berquist Company, "Conformable, Thermally Conductive Material for Filling Air Gaps", "Gap Pad VO", May 7, 2007, p. 1.

The Berquist Company, "Highly Conformable, Thermally Conductive Material for Filling Air Gaps", "Gap Pad VO Soft", May 7, 2007, p. 1.

* cited by examiner

Primary Examiner—Boris L Chervinsky
(74) Attorney, Agent, or Firm—Fogg & Powers LLC

(57) ABSTRACT

A heat sink for an electronics enclosure is disclosed. The heat sink comprises a thermal conduction section with an inner surface and an outer surface, the thermal conduction section having an extended profile that tapers from a first end having a first thickness to a second end having a second thickness that is larger than the first thickness. A mounting plate is contiguous with the second end, and the mounting plate is configured to couple the heat sink to a chassis of the electronics enclosure. A thermal interface pad is coupled to the outer surface of the thermal conduction section.

23 Claims, 4 Drawing Sheets

CHASSIS MOUNTED HEAT SINK SYSTEM

BACKGROUND

Outdoor telecommunications enclosures that contain high-power electronic components require a method to dissipate the heat generated by the electronic components. At the same time, it is often necessary that the electronic components be enclosed in a sealed outdoor enclosure to protect the electronic components from the outside environment. Typically, the heat from these components travels out through a heat sink to the outside environment.

In most cases, the high-power electronic components are attached to the heat sink. The heat sink easily passes the heat energy generated from the components to any outer surface areas of the sealed enclosure. However, heat generated by any surface opposite the attached heat sink surface typically dissipates into the air within the enclosure. Any heat energy generated on these opposite surfaces (for example, dissipated via natural convection) is detrimental to the performance of the system. To date, attempts to correct this situation by enlarging the heat sink's footprint have resulted in increased weight of the enclosure, additional manufacturing costs, and reduced access to the components within the sealed enclosure.

For the reasons stated above and for other reasons stated below which will become apparent to those skilled in the art upon reading and understanding the present specification, there is a need in the art for improvements in removing heat energy generated by a plurality of electronic components in a sealed enclosure.

SUMMARY

The following specification discusses a chassis mounted heat sink system. This summary is made by way of example and not by way of limitation. It is merely provided to aid the reader in understanding some aspects of at least one embodiment described in the following specification.

Particularly, in one embodiment, a heat sink for an electronics enclosure is provided. The heat sink comprises a thermal conduction section with an inner surface and an outer surface, the thermal conduction section having an extended profile that tapers from a first end having a first thickness to a second end having a second thickness that is larger than the first thickness. A mounting plate is contiguous with the second end, and the mounting plate is configured to couple the heat sink to a chassis of the electronics enclosure. A thermal interface pad is coupled to the outer surface of the thermal conduction section.

DRAWINGS

These and other features, aspects, and advantages are better understood with regard to the following description, appended claims, and accompanying drawings where:

The various described features are drawn to emphasize features relevant to the embodiments disclosed. Like reference characters denote like elements throughout the figures and text of the specification.

DETAILED DESCRIPTION

The following detailed description describes at least one embodiment for a chassis mounted heat sink system that engages a plurality of high-power, heat-generating ("hot") electronic components through a thermal interface to substantially disperse the heat out of a chassis enclosure hosting the components. Advantageously, the "hot" components are thermally coupled to at least one chassis mounted heat sink where, in one embodiment, the "hot" components are mounted on access doors to the enclosure. The chassis mounted heat sink is mounted to the enclosure such that at least one side (face) of the heat sink nearly contacts (for example, thermally couples) the "hot" component when each access door is closed. In one embodiment, a gap-filling thermal interface material is applied to the surface of the chassis mounted heat sink such that a low thermal resistance path is created for the heat from the surface of the component to escape through the interface material. In one implementation, the chassis mounted heat sink conducts the heat into a top plate of the enclosure, in which the top plate comprises a plurality of fins, such as cast metal fins, to extract the heat into the ambient air surrounding the exterior of the enclosure.

An advantage of the present chassis mounted heat sink system is that the heat sink does not block access to the "hot" components when the enclosure is serviced. When any access door is open, the heat sink remains inside the enclosure. The heat sink system thermally couples with the "hot" components once any of the access doors are closed. Additionally, since in one implementation the chassis mounted heat sink is a profile extrusion, attachment rails can be incorporated into the heat sink such that additional electronic components can be mounted inside the enclosure.

Figure 1:
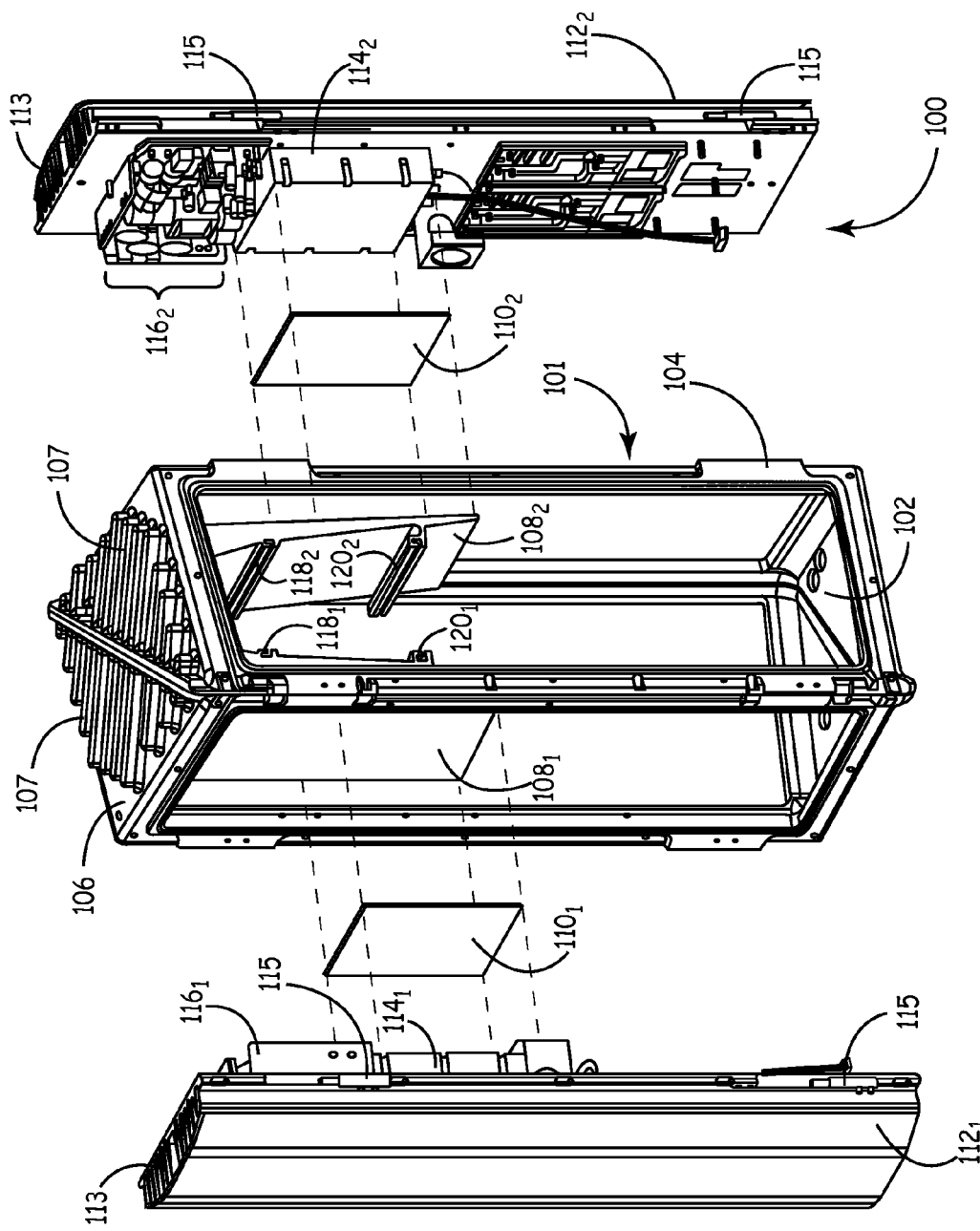
FIG. 1 is a exploded perspective view of an electronics enclosure.

FIG. 1 is an exploded perspective view of an electronics enclosure 100. The enclosure 100 comprises a chassis 101 and panels $112_1$ and $112_2$. The chassis 101 comprises a base plate 102, a chassis frame 104 coupled to the base plate 102, and a top plate 106 having an upper surface and a lower surface and coupled to the chassis frame 104 at an opposing side from the base plate 102. In one implementation, the upper surface of the top plate 106 further comprises a plurality of heat transfer fins 107 thereon as illustrated in FIG. 1. Each of the panels 112 are configured for attachment to the chassis frame 104 between the base plate 102 and the top plate 106. In one implementation, at least one of the panels 112 is an access door to the chassis 101. The panels 112 can be movably attached to the chassis 101 by a plurality of hinges 115. Each of the panels 112 includes a plurality of heat transfer fins 113 disposed in an interior portion of the panel 112.

Within the enclosure structure 104 are a pair of heat sinks $108_1$ and $108_2$ mounted to the lower surface of the top plate 106. It is understood that the enclosure 100 is capable of accommodating any appropriate number of heat sinks 108 and panels 112 (for example, at least one pair of heat sinks $108_1$ and $108_2$ and at least two panels $112_1$ and $112_2$) in a single enclosure 100. In one implementation, the heat sinks $108_1$ and $108_2$ are formed with first mounting rails $118_1$ and $118_2$, and second mounting rails $120_1$ and $120_2$ as shown in FIG. 1. Moreover, the heat sinks $108_1$ and $108_2$ can be composed of at least one of aluminum, magnesium, steel, zinc, or combinations thereof.

Each of the panels $112_1$ and $112_2$ can include heat generating components $114_1$ and $114_2$ and major electronic components $116_1$ and $116_2$, respectively. For purposes of this description, the terms "heat generating" and "major electronic" components identifies the electronic components within the enclosure 100 that generate a substantial amount of heat energy to be dissipated. For example, any of the heat generating components $114_1$ and $114_2$ and major electronic components $116_1$ and $116_2$ considered "hot" are placed within thermal contact of the heat sinks $108_1$ and $108_2$.

The heat sinks $108_1$ and $108_2$ form a chassis mounted heat sink system. The heat sinks $108_1$ and $108_2$ form at least one conductive heat path between the top plate 106 and the panels 112. The heat sinks $108_1$ and $108_2$ are shaped to substantially increase conduction through the at least one conductive heat path.

In one implementation, a pair of thermal interface pads $110_1$ and $110_2$ is respectively disposed between the heat generating components $114_1$ and $114_2$ and an outer surface of the heat sinks $108_1$ and $108_2$. In the example embodiment of FIG. 1, the thermal interface pads 110 comprise a thermally conductive material that substantially fills any gaps between the heat generating components $114_1$ and $114_2$ and an outer surface of the heat sinks $108_1$ and $108_2$. The thermally conductive material can include, for example, a thermally-conductive polymer, a silicone-filled polymer, and the like.

In operation, the chassis mounted heat sink system is formed by the heat sinks $108_1$ and $108_2$ thermally coupled with the heat generating components $114_1$ and $114_2$ and major electronic components $116_1$ and $116_2$ when the system is enclosed (for example, when the panels 112 are closed and the electronic components are energized). In one implementation, the thermal interface pads $110_1$ and $110_2$ substantially reduce thermal resistance in the at least one conductive heat path. For example, the thermal interface pads 110 are sufficiently firm to allow more control when applying the pads to the heat sink surface of the heat sinks 108.

Figure 2:
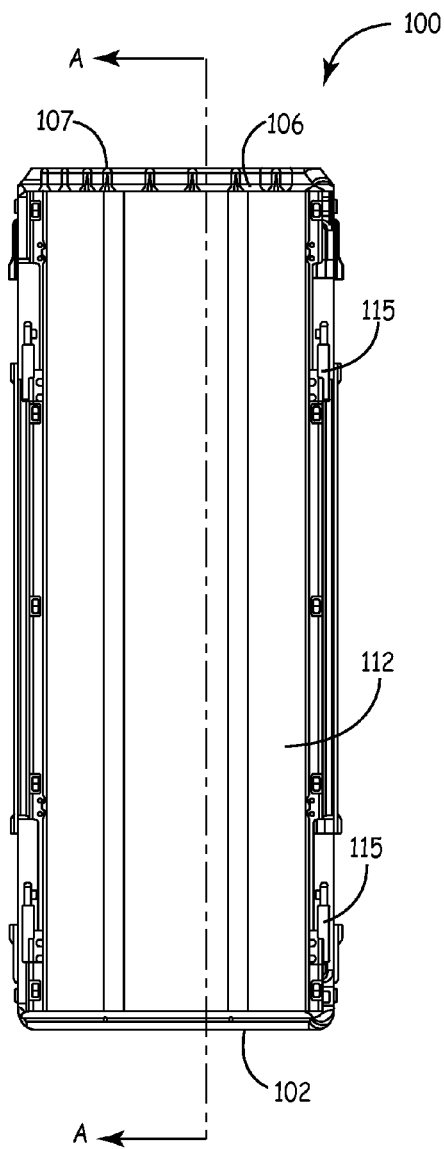
FIG. 2 is an elevational view of one side of the enclosure of FIG. 1 in an assembled form.
Figure 3:
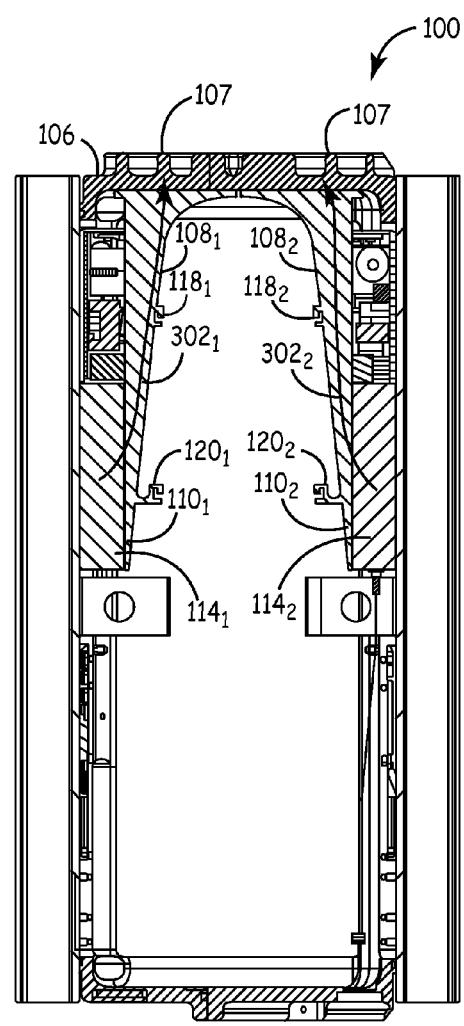
FIG. 3 is a cross-sectional view along section A-A of FIG. 2.

FIG. 2 is a side elevation view of the enclosure 100 of FIG. 1 in assembled form. FIG. 3 is a cross-sectional view of the enclosure 100 along section A-A of FIG. 2 showing the chassis mounted heat sink system in more detail. Referring to FIG. 3, the chassis mounted heat sink system includes the top plate 106 with the plurality of heat transfer fins 107, the heat sinks $108_1$ and $108_2$, and the thermal interface pads $110_1$ and $110_2$. In one implementation, the heat sinks $108_1$ and $108_2$ are mounted to the lower surface of the top plate 106 with a heat sink mounting plate (discussed in further detail below with respect to FIG. 4). In at least one alternate implementation, the heat sinks $108_1$ and $108_2$ are formed as at least a portion of the top plate 106. As shown in FIG. 3, the heat sinks $108_1$ and $108_2$ are mounted directly opposite of one another to form a generally u-shaped profile. It is understood that alternate mounting options can be used.

As shown in FIGS. 1 and 3, on the inner surfaces of the heat sinks $108_1$ and $108_2$ are a first set of mounting rails $118_1$ and $118_2$ and a second set of mounting rails $120_1$ and $120_2$ for mounting additional electronic assemblies (for example, at least one electronic circuit card) inside the enclosure 100. As further shown in FIG. 3, the heat generating components $114_1$ and $114_2$, along with the heat sinks $108_1$ and $108_2$, form the conductive heat paths $302_1$ and $302_2$ (respectively) within the enclosure 100. In one implementation, the components 114 and the outer surfaces of the heat sinks 108 are thermally coupled by the thermal interface pads 110 to remove heat energy generated by the electronic components 114 through the upper surface of the top plate 106 when the enclosure 100 is closed.

Figure 4:
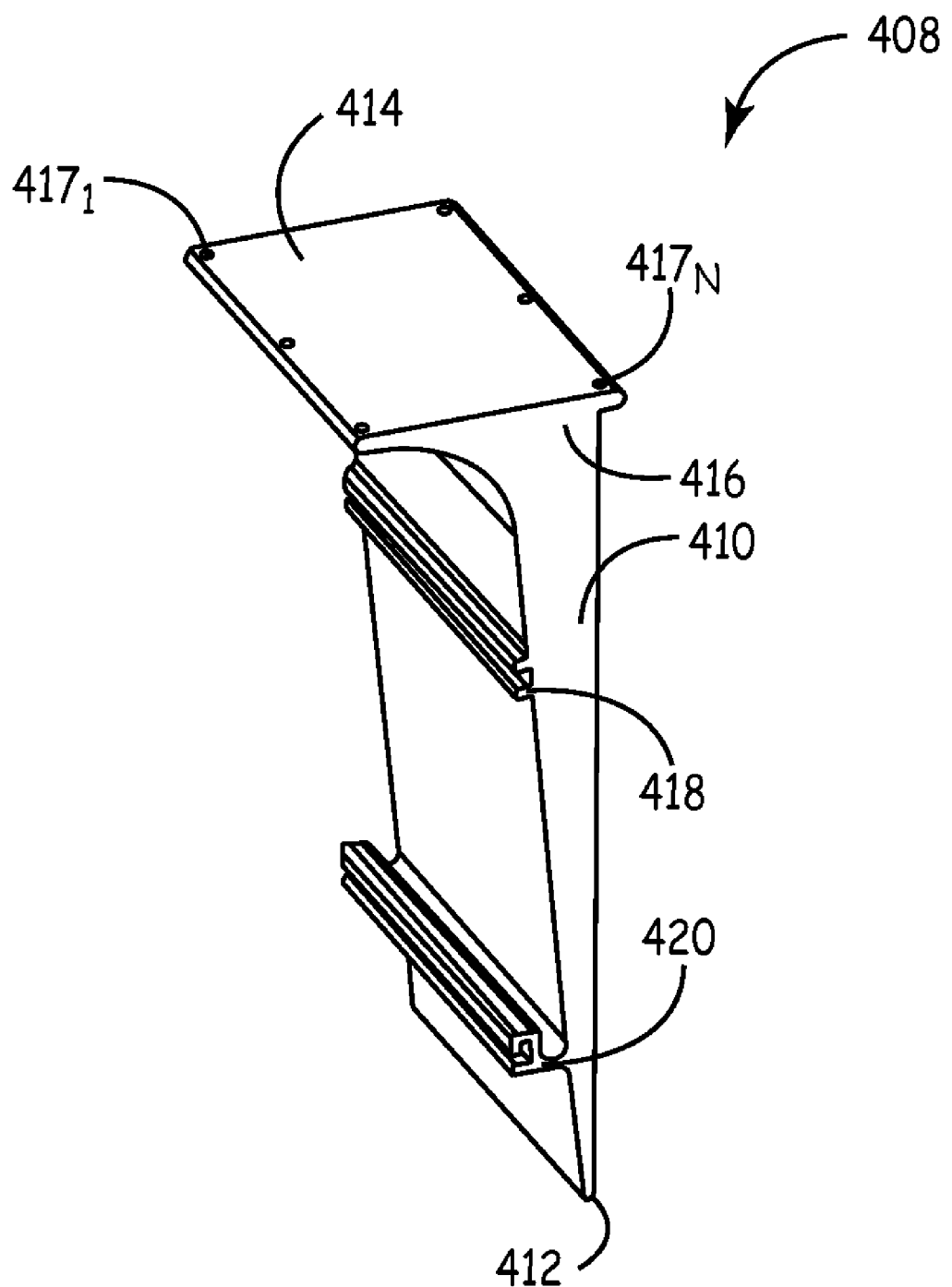
FIG. 4 is an elevated perspective view of a chassis mountable heat sink.

FIG. 4 is an elevated perspective view of a chassis mountable heat sink 408. In the example embodiment of FIG. 4, the heat sink 408 corresponds to the heat sinks $108_1$ and $108_2$ as shown in FIGS. 1 and 3. The heat sink 408 shown in FIG. 4 comprises a thermal conduction section 410 having a first end 412 and a mounting plate 414 contiguous with a second end 416. In the example embodiment of FIG. 4, the thermal conduction section 410 has an extended profile that tapers from the first end 412 having a first thickness to the second end 416 having a second thickness that is larger than the first thickness. Moreover, the mounting plate 414 can include apertures $417_1$ to $417_N$ for coupling the heat sink 108 to the lower surface of the top plate 106 of the electronics enclosure of FIG. 1. The heat sink 408 can include a first mounting rail 418 and a second mounting rail 420 on the inner surface of the thermal conduction section 410. The thermal conduction section 410 has a wedge shape to substantially increase thermal conduction while substantially decreasing the weight of the heat sink 408.

Figure 5:
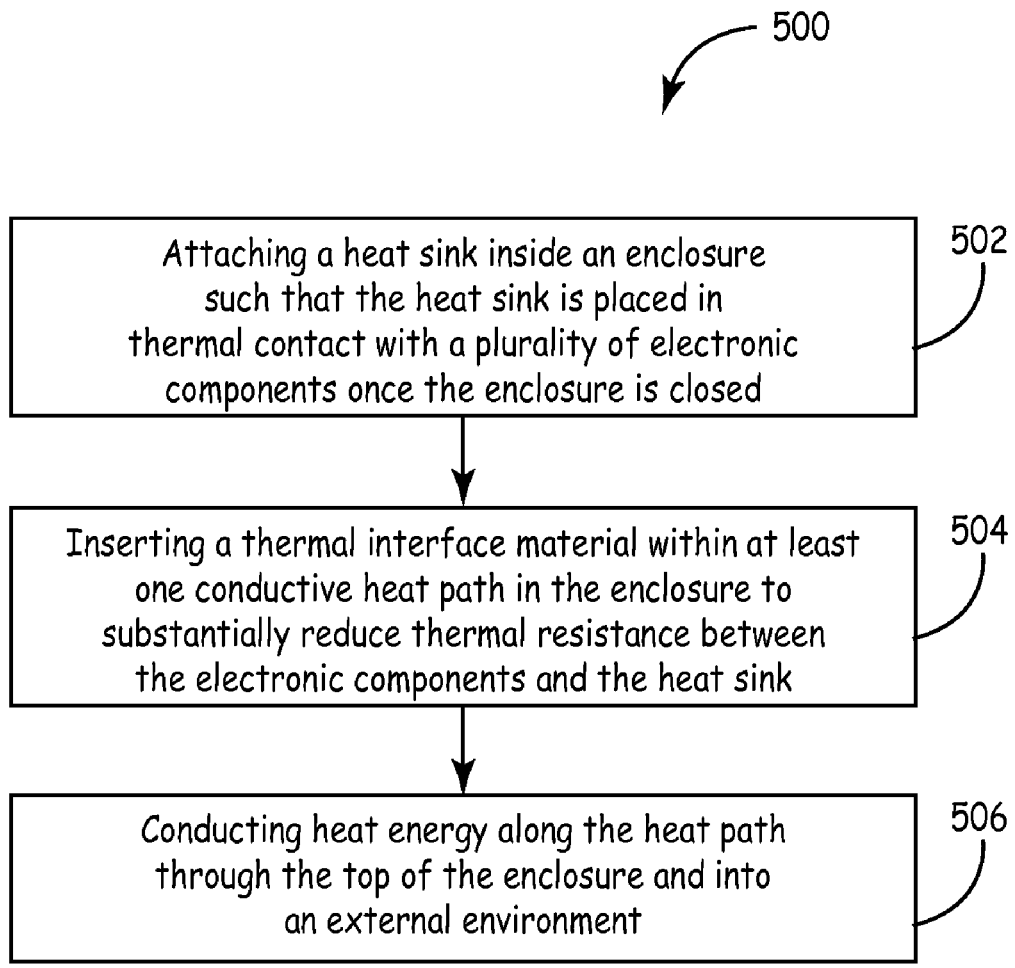
FIG. 5 is a flow diagram of a method for removing heat from an electronics enclosure.

FIG. 5 is a flow diagram of a method 500 for removing heat from an electronics enclosure. The method of FIG. 5 addresses using the chassis mounted heat sinks 108 to extract heat energy from the chassis enclosure of FIG. 1 using a thermal interface material (for example, the thermal interface pads 110 of FIG. 1) to substantially reduce thermal resistance between the heat sinks and a plurality of electronic components mounted on panels (for example, the panels 112 of FIG. 1) inside the enclosure.

At block 502, the method 500 involves attaching at least one heat sink inside of the enclosure such that the heat sink is placed in thermal contact with a plurality of electronic components once the enclosure is closed. In one implementation, the plurality of electronic components is mounted on at least one panel attached to the chassis enclosure. At block 504, the method 500 involves inserting a thermal interface material within at least one conductive heat path in the enclosure to substantially reduce thermal resistance between the electronic components and the heat sink. In one implementation, the thermal interface material is a thermal interface pad that couples an outer surface of the heat sink with the electronic components installed on at least one panel of the enclosure. At block 506, the at least one heat path conducts heat energy through a top of the enclosure and into an external environment. In one implementation, conducting the heat energy through the top of the enclosure further reduces an operating temperature inside the enclosure below a prescribed component temperature threshold level.

This description has been presented for purposes of illustration, and is not intended to be exhaustive or limited to the embodiment(s) disclosed. The embodiments disclosed are intended to cover any modifications, adaptations, or variations which fall within the scope of the following claims.

What is claimed is:

1. A heat sink for an electronics enclosure, the heat sink comprising:
   a thermal conduction section with an inner surface and an outer surface, the thermal conduction section having an extended profile that tapers from a first end having a first thickness to a second end having a second thickness that is larger than the first thickness;
   a mounting plate contiguous with the second end, the mounting plate configured to couple the heat sink to a chassis of the electronics enclosure; and
   a thermal interface pad coupled to the outer surface of the thermal conduction section.

2. The heat sink of claim 1, further comprising at least one mounting rail on the inner surface of the thermal conduction section.

3. The heat sink of claim 1, wherein the thermal conduction section has a wedge shape.

4. The heat sink of claim 1, wherein the thermal interface pad comprises a thermally-conductive material.

5. The heat sink of claim 4, wherein the thermally-conductive material comprises a thermally-conductive polymer or a silicone-filled polymer.

6. A heat sink system for an electronics enclosure, the heat sink system comprising:
 a chassis for the electronics enclosure;
 a top plate on the chassis, the top plate having an upper surface and a lower surface;
 at least one heat sink disposed within the chassis, the heat sink comprising:
  a thermal conduction section with an inner surface and an outer surface, the thermal conduction section having an extended profile that tapers from a first end having a first thickness to a second end having a second thickness that is larger than the first thickness;
  a mounting plate contiguous with the second end, the mounting plate attached to the lower surface of the top plate; and
  a thermal interface pad coupled to the outer surface of the thermal conduction section; and
 wherein the heat sink provides at least one thermally conductive path to remove heat from one or more electronic components in the electronics enclosure.

7. The heat sink system of claim 6, further comprising a plurality of heat transfer fins on the upper surface of the top plate.

8. The heat sink system of claim 6, wherein the thermal interface pad comprises a thermally conductive material.

9. The heat sink system of claim 8, wherein the thermally conductive material comprises a thermally-conductive polymer or a silicone-filled polymer.

10. An electronics enclosure, comprising:
 a base plate;
 a chassis frame coupled to the base plate;
 a top plate coupled to the chassis frame at an opposing side from the base plate, the top plate having an upper surface and a lower surface;
 at least one panel movably attached to the chassis frame between the base plate and the top plate;
 a plurality of electronic components on the at least one panel;
 a chassis mounted heat sink, comprising:
  a first heat sink mounted to the lower surface of the top plate with a first heat sink mounting plate; and
  a second heat sink mounted to the lower surface of the top plate with a second heat sink mounting plate, the second heat sink mounted opposite of the first heat sink to form a generally u-shaped profile;
 wherein at least one conductive heat path is formed within the enclosure by each of the first and second heat sinks once the enclosure is closed; and
 wherein the at least one conductive heat path removes heat energy from the plurality of electronic components to the upper surface of the top plate when the enclosure is closed.

11. The enclosure of claim 10, wherein the at least one panel is an access door.

12. The enclosure of claim 10, wherein the at least one panel includes a plurality of heat transfer fins disposed in an interior portion of the at least one panel.

13. The enclosure of claim 10, further comprising a plurality of heat transfer fins on the upper surface of the top plate.

14. The enclosure of claim 10, wherein each of the first and the second heat sinks include at least one mounting rail.

15. The enclosure of claim 10, wherein each of the first and the second heat sinks are extruded with a first conduction profile.

16. The enclosure of claim 15, wherein the first conduction profile is shaped to substantially increase conduction through the at least one conductive heat path.

17. The enclosure of claim 15, wherein the first conduction profile has a wedge shape.

18. The enclosure of claim 10, further comprising a thermal interface pad contiguous with an outer surface of each of the heat sinks.

19. The enclosure of claim 18, wherein the thermal interface pad conforms to the outer surface of the each of the heat sinks to substantially fill any air gaps between the heat sinks and the electronic components.

20. A method for removing heat from an electronics enclosure, the method comprising:
 attaching at least one heat sink inside the enclosure such that the heat sink is placed in thermal contact with a plurality of electronic components once the enclosure is closed; and
 inserting a thermal interface material within at least one conductive heat path in the enclosure by coupling an outer surface of the at least one heat sink and the electronic components installed on at least one panel of the enclosure with a thermal interface pad to substantially reduce thermal resistance between the electronic components and the heat sink; and conducting heat energy along the heat path through the top of the enclosure and into an external environment.

21. The method of claim 20, and further comprising mounting additional electronic assemblies inside the enclosure with a set of mounting rails attached to the heat sink.

22. The method of claim 20, and further comprising providing the at least one conductive heat path for the plurality of electronic components with the heat sink.

23. The method of claim 20, wherein conducting the heat energy along the heat path further comprises reducing an operating temperature inside the enclosure below a prescribed component temperature threshold level.

* * * * *